(12) United States Patent
Mu et al.

(10) Patent No.: US 9,240,224 B2
(45) Date of Patent: *Jan. 19, 2016

(54) NON-VOLATILE MEMORY (NVM) WITH VARIABLE VERIFY OPERATIONS

(71) Applicant: FREESCALE SEMICONDUCTOR, INC., Austin, TX (US)

(72) Inventors: Fuchen Mu, Austin, TX (US); Yanzhuo Wang, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 86 days.

This patent is subject to a terminal disclaimer.

(21) Appl. No.: 14/102,666

(22) Filed: Dec. 11, 2013

(65) Prior Publication Data

US 2014/0321212 A1 Oct. 30, 2014

Related U.S. Application Data

(63) Continuation-in-part of application No. 13/874,119, filed on Apr. 30, 2013, now Pat. No. 8,879,330.

(51) Int. Cl.
*G11C 11/34* (2006.01)
*G11C 7/04* (2006.01)
*G11C 16/34* (2006.01)

(52) U.S. Cl.
CPC *G11C 7/04* (2013.01); *G11C 16/34* (2013.01); *G11C 16/3481* (2013.01); *G11C 16/3495* (2013.01)

(58) Field of Classification Search
CPC .......... G11C 16/3445; G11C 16/3459; G11C 16/3495; G11C 16/3481; G11C 16/34; G11C 7/04
USPC ............. 365/185.09, 185.22, 185.29, 185.19, 365/211
See application file for complete search history.

(56) References Cited

U.S. PATENT DOCUMENTS

| 6,381,670 | B1 | 4/2002 | Lee et al. |
| 7,397,703 | B2 | 7/2008 | Niset et al. |
| 7,839,690 | B2 | 11/2010 | Lee et al. |
| 7,920,427 | B2 | 4/2011 | Marquart |

OTHER PUBLICATIONS

U.S. Appl. No. 13/874,119, Office Action—Allowance, mailed Jun. 30, 2014.

*Primary Examiner* — Gene Auduong

(57) ABSTRACT

A method of soft programming a non-volatile memory (NVM) array includes determining a first number based on a temperature of the NVM array and applying the first number of soft program pulses to a section of the NVM array. A first soft program verify of the section of the NVM array is then performed for a first time after completing the applying the first number of soft program pulses.

20 Claims, 4 Drawing Sheets

| INITIAL SETTINGS | | |
|---|---|---|
| TEMP RANGE (°C) | PULSE COUNT DATA | NREG (50%) |
| [-40, 0] | 4 | 2 |
| (0, 40] | 6 | 3 |
| (40, 85] | 8 | 4 |
| (85, 150] | 10 | 5 |

FIG. 5

| UPDATED SETTINGS | | |
|---|---|---|
| TEMP RANGE (°C) | PULSE COUNT DATA | NREG (50%) |
| [-40, 0] | 4 | 2 |
| (0, 40] | 6 | 3 |
| (40, 85] | 10 | 5 |
| (85, 150] | 10 | 5 |

FIG. 6

NON-VOLATILE MEMORY (NVM) WITH VARIABLE VERIFY OPERATIONS

RELATED CASES

This is a continuation-in-part of U.S. patent application Ser. No. 13/874,119, filed Apr. 30, 2013, titled NON-VOLATILE MEMORY (NVM) WITH VARIABLE VERIFY OPERATIONS, with inventors Fuchen Mu and Yanzhou Wang, and assigned to the assignee hereof.

BACKGROUND

1. Field of the Disclosure

This disclosure relates generally to non-volatile memories (NVMs), and more specifically, to NVMs that perform a variable number of soft program verify operations.

2. Description of the Related Art

Typical non-volatile memories (NVMs) use charge pumps for generating erase voltages to apply to the memory cells during program and erase operations. The voltages selected for program and erase operations are based on desirable characteristics for the threshold voltage distribution of the memory cells and the program and erase performance of the cells that are programmed or erased. For a given NVM, there is a determined charge pump voltage for program and erase for each relevant node of the NVM cell. For erase this is typically the gate voltage and the well voltage on the memory cells. For programming this is typically the gate voltage and the drain voltage on the memory cells. In addition there is soft program which is used to correct over-erased memory cells which occurs when NVM bit cells are erased to the point that they have excessive leakage and can result in difficulty reading the logic state of a selected cell that is coupled to the same bit line as the over-erased cell which is in an unselected row. Because soft programming is performed on a limited number of cells at a time, the time for the soft programming is the dominate component in embedded erase operations, especially for large blocks.

The embedded erase operation can include modes such as pre-program, erase, compaction and soft program during which voltage pulses are applied to the memory cells. Each of the operational cycles can include a verify operation to ensure that a specified number of the memory cells are in the intended state. The verify operations are performed after each pulse or series of voltage pulses is applied. If the cells do not pass verify, then another pulse or series of voltage pulses which could be at a higher voltage level, depending on the specific operation being performed, is applied until the specified number of cells are in the intended state. The number of voltage pulse series for program and erase that are applied typically increases with the lifecycle age of the memory array. The increase in the number of pulses affects the amount of time required to complete an operation. In addition, temperature will also impact the number of pulses, with the number of pulses also increasing with temperature.

Thus there is a need for erase operations with improved soft programming performance and reliability over the lifetime of the memory.

BRIEF DESCRIPTION OF THE DRAWINGS

The benefits, features, and advantages of the present disclosure will become better understood with regard to the following description, and accompanying drawings where:

FIG. 5 is a pulse count table for soft programming with multiple temperatures; and FIG. 6 is the pulse count table of FIG. 5 which may result after a number of program/erase operations.

DETAILED DESCRIPTION

In one aspect a non-volatile memory has an embedded erase operation that includes a soft program operation in which soft program verify is postponed until a number of pulses have been applied for soft programming. The number of pulses is based in part on temperature. The number of pulses for soft programming may also be changed after a number of erase operations have been performed. This is better understood by reference to the drawings and the following written description.

Figure 1:
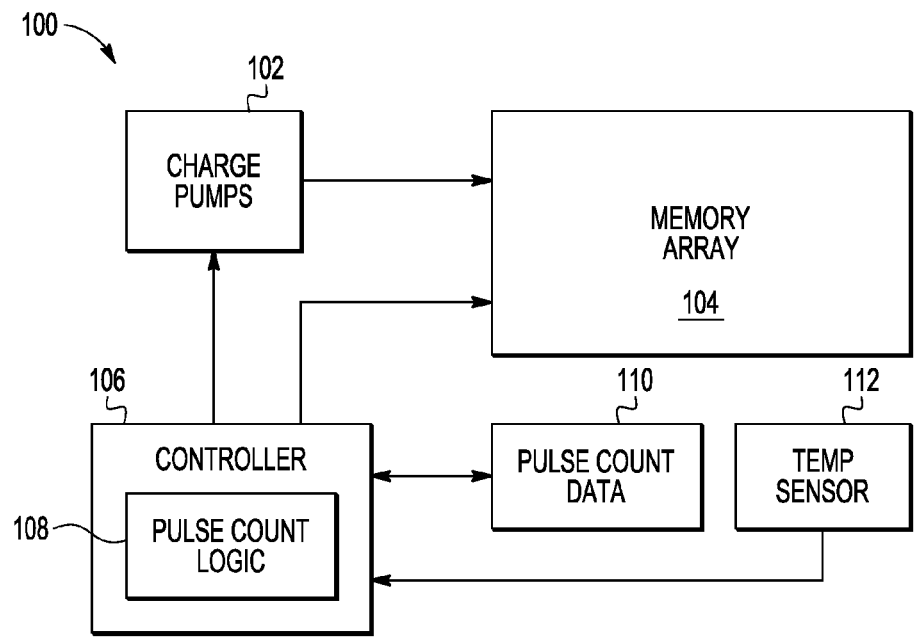
FIG. 1 is a block diagram of a non-volatile memory (NVM) device according to an embodiment.

Shown in FIG. 1 is a non-volatile memory (NVM) device 100 having a set of charge pumps 102, a memory controller 106 coupled to charge pumps 102, a pulse count data table 110 coupled to memory controller 106, a temperature sensor 112 coupled to controller 106, and an NVM array 104 coupled to charge pumps 102. NVM array 104 typically includes row decoders, column decoders, and sense amplifiers (not shown in the figure) that are used to operate memory cells in the NVM array. Controller 106 controls the operations of NVM array 104 including reading, programming, and erasing.

Pulse count logic 108 can be included in controller 106 to determine when to start using verify operations during various memory operations, such as pre-program, erase, compaction, soft program, and program operations. Pulse count logic 108 can use information from pulse count data 110 to determine the number of pulses to apply to the memory cells before initiating verify operations. The pulse count data 110 can be updated to reflect an increased number. The number of series of pulses required to pass a verify operation will typically increase with lifecycle age and/or with changes in operating temperature, depending on the operation being performed. Pulse count data 110 can be implemented as a look-up table, one or more formulas, or other suitable implementations. Pulse count data 110 can be stored for each range of temperatures and can be dynamically updated if current pulse count is greater than the existing stored pulse count by a predetermined amount such as 2. The predetermined amount is based on historical data indicating a certain amount of aging. Pulse count logic 108 can apply a factor such as a percentage to the stored pulse count for a particular temperature range to generate a value for a specified number of pulse series to perform before performing soft program verify. The number actually used may referenced as NREG having been stored in a register.

Figure 2:
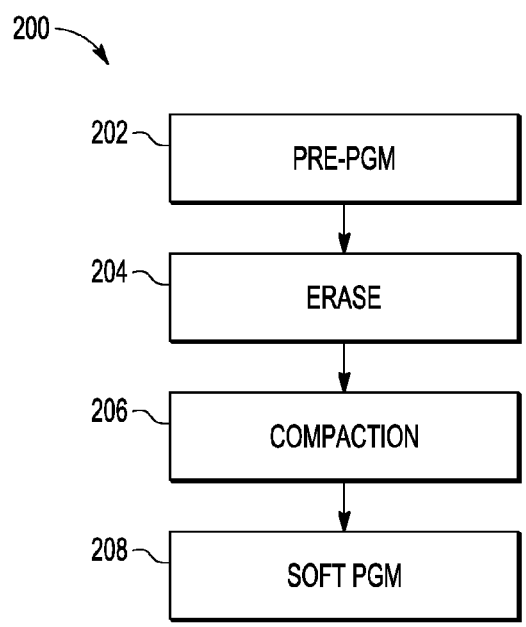
FIG. 2 is a flow diagram of an embodiment of operations that can be performed by the NVM device of FIG. 1.

Referring now to FIGS. 1 and 2, FIG. 2 shows a flow diagram of an embodiment of an embedded erase operation that can be performed by the NVM device of FIG. 1 including pre-program operation 202, erase operation 204 that can be called a Fowler Nordheim (FN) erase operation, compaction operation 206, and soft program operation 208. Pre-program operation 202 can include determining whether a pre-program operation is required to bring all cells in the NVM array 104 to a pre-program level. The pre-program threshold voltage level will depend on the configuration/technology of the transistors that form the memory cells. For erase operation 204, the threshold voltage of all of the memory cells is brought to an erased level. Compaction operation 206 can be performed to ensure that the threshold voltage of all of the memory cells is above a minimum compaction level. Soft program operation 208 can be performed to ensure the threshold voltage of all of the memory cells is above a minimum soft program level.

A series of voltage pulses is applied to the memory cells in NVM array 104. After a specified number of voltage pulse series is applied, a verify operation is performed to ensure the threshold voltage of all the memory cells pass a specified verify level for the operation being performed. One or more series of pulses can subsequently be applied to the memory cells until the threshold voltage of all of the memory cells are above or below a respective specified verify level. For example, the erase verify operation ensures the threshold voltage of all the memory cells is below erase verify level. Soft program verify operation ensures the threshold voltage of all the memory cells is above soft program verify level. The respective verify operation can be performed after each subsequent series of pulses is applied. The delay in initially performing the verify operation until a specified number of pulse series have been applied reduces the amount of time required to perform the pre-program, erase, compaction and soft program operations during manufacturing test and field operation. The specified number of pulses can also be changed after performing a verify operation if the number of pulse series applied has increased above a certain amount since the previous operation, as further described herein. NVM array 104 is divided into blocks. All of the cells in a given block can be erased at the same time. Also each block is divided into sections. Soft programming is performed on a section by section basis.

Figure 3:
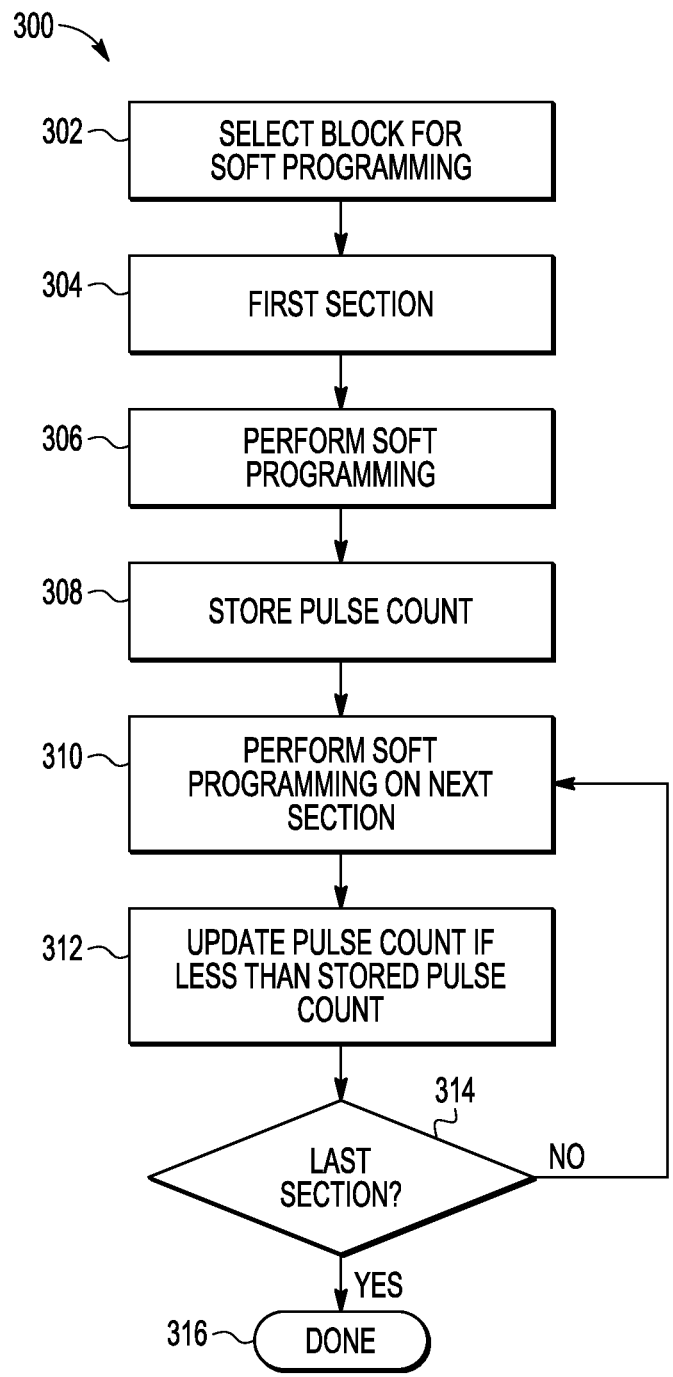
FIG. 3 is a flowchart of a portion of a soft program operation that can be performed to determine the pulse count of the array block by the NVM device of FIG. 1.

FIG. 3 is a flowchart diagram for performing a method 300 that is an initial portion of a soft programming operation that can be implemented by controller 106 in FIG. 1 and may also be used for updating the initial pulse count in the soft programming operation. Soft programming includes applying soft programming pulses and a subsequent soft program verify after each soft programming pulse. Method 300 is repeated for each block and at a number of different temperatures for each block. A block for soft programming is selected in a step 302. A first section of the block is selected in a step 304. Soft programming is performed on the selected section in a step 306. The number of programming pulses required to achieve the soft programming for the selected section is stored. This storing may be in a register, in a portion of NVM array 104, or some other storage. In a step 310 a next section of the block is soft programmed. If the number of pulses required is less than the stored pulse count in the first section, the new pulse count is stored with the new pulse count. The count is kept updated as each section is soft programmed. At a step 314 a determination is made if the last section has been soft programmed. If no, step 310 of soft programming is performed on the next section. If yes, then soft programming is complete and method 300 is then considered done as shown at step 316 for that block at that temperature. The lowest soft program pulse count for a selected block is the retained value at step 316. Method 300 is then repeated for each block with a resulting pulse count stored for each block at each soft programming temperature. Method 300 may be repeated dynamically at any time to update the pulse count. For example, after 10,000 program/erase cycles, NVM array 104 may have changed its program/erase characteristics, and it may be useful to update the pulse count for soft programming.

Figure 4:
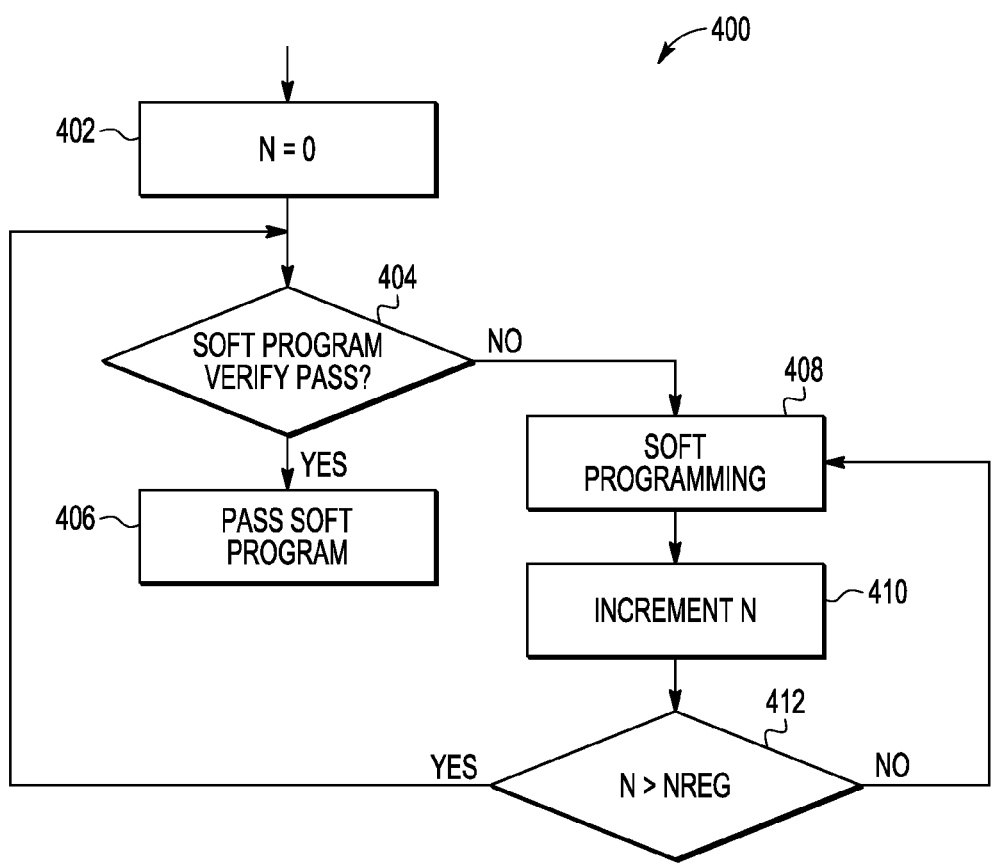
FIG. 4 is a flowchart of another portion of the soft program operation for each section of the array block.

Shown in FIG. 4 is a method 400 for performing soft programming using the pulse count obtained by method 300 of FIG. 3. Method 400 begins with a step 402 showing a pulse count N of zero. A step 404 performs a soft program verify step 404 which determines if the particular section in the block passes. If it does pass, then the section in the block has passed soft program operation as shown in step 406. The next section in the block, if it is not the last one, is going to repeat method 400. This can occur, for example, if there was an interruption to the soft programming process, which had been successfully performed, and the interruption was prior to the verification that the soft programming was successful. If the block does not pass soft program verify, soft programming is performed at a step 408 with a single pulse. This is performed on each section of the block. The pulse count N is then incremented to 1. If pulse count N is greater than a value in a pulse count register NREG soft program verify is performed to determine if it passed. The value in count register NREG is based on the pulse count obtained from method 300, and this stored number itself may also be simply referenced as NREG. If pulse count N is not greater than NREG, soft programming is performed with another pulse. Pulse count N is then incremented and compared to NREG again. Soft programming pulses will continue to be applied in this manner until pulse count N does exceed NREG. If the block fails soft program verify at step 404, then another soft program pulse is applied at step 408 and pulse count N is incremented. In this case pulse count is known to exceed NREG so soft program verify will again be performed. This continues until all of the sections in the block pass soft program verify.

The count value obtained in method 300 is used in determining NREG, which is or is related to the minimum soft programming pulses applied during method 400. This number NREG may be the count value, some percentage of the count value, or some fixed or variable amount less than the count value obtained by performing method 300 for the block for a specific temperature range. In FIG. 5 and FIG. 6 are shown tables showing NREG and count values for temperature ranges. Shown in FIG. 5 are initial settings and shown in FIG. 6 are updated settings obtained after some period of time. The initial settings in this case show NREG at 50 percent of the pulse count. Thus, for the temperature range of minus 40 degrees Celsius to zero degrees Celsius, the pulse count is 4 and NREG is 2. For the next temperature range, zero degrees Celsius to 40 degrees Celsius, the pulse count is 6 and NREG is 3. This shows the increase in pulse count and NREG with temperature for soft programming which is a type of programming. The table of FIG. 6, which is developed after the initial settings of the table for FIG. 5, pulse count data has been updated and the pulse count and NREG for temperature range 40 degrees Celsius to 85 degrees Celsius has changed. In the initial settings, the pulse count is 8 and NREG is 4. Using method 400 for the 40 degrees Celsius to 85 degrees Celsius temperature range, the updated pulse count is 10 and NREG is 5. At this point, this is the only temperature range that has a different pulse count and NREG. This could be the result of running method 300 only at that temperature and thus that temperature being the only one updated or it could be that the pulse count and NREG didn't change for the other temperatures.

The use of NREG at a reduced number from the pulse count provides for margin in avoiding over soft programming. Over soft programming results in increased soft programming time and providing unneeded additional stress to the NVM cells, which can even have the particularly deleterious effect of making one or more NVM bit cells' threshold voltage higher than the erase verify level. On the other hand, providing a number of soft programming pulses before performing soft program verify reduces the amount of time involved with soft program verify and thus reduces the overall soft program operation whether it is by NREG at 50% of the pulse count or at the full pulse count.

After method 300 updates the pulse count data value, NREG can be updated taking the updated pulse count data value into account. The specified number of NREG may be, as stated previously, a percentage of the pulse count data value. The percentage can be specified by a user. A lower percentage will result in the verify operations being conducted after a fewer number of pulses, while a higher percentage will result in the verify operations being conducted after a greater number of pulses. Similarly to the updated pulse count data value, the updated specified number of pulses of NREG can be specific to a particular range of temperatures and/or lifecycle age of the corresponding memory array.

By now it is apparent that a method of soft programming a non-volatile (NVM) memory has been disclosed. The method includes determining a first number of soft program pulses based on a temperature of the NVM array. The method further includes applying the first number of soft program pulses to a section of the NVM array. The method further includes performing a first soft program verify of the section of the NVM array for a first time after completing the applying the first number of soft program pulses. The method may further include, if the performing the first soft program verify determines soft program was not successful, applying an additional soft program pulse to the section of the NVM array followed by a soft program verification. The method may further include determining if the first number should be updated based on a number of soft program pulses required to successfully soft program a block of the NVM array. The method may further include, if the performing the first soft program verify determines soft program of the section of the NVM was not successful, performing soft program verifies after the first number of soft program pulses are again applied until a determination that the soft programming has been successful. The method may further include, if the performing the first soft program verify determines a soft program of the section of the NVM was successful, incrementing to a next section of the NVM array and performing soft program verifies after the first number of soft program pulses are applied until a determination that the soft program has been successful. The method may have a further characterization by which the determining is further characterized by the first number being further based on a number of program/erase cycles already performed on a block of the NVM array that includes the section of the NVM array. The method may have a further characterization by which the determining is further characterized by the first number being further based on a number of program/erase cycles already performed on a block of the NVM array that includes the section of the NVM array. The method may have a further characterization by which the determining is further characterized by the first number being selected from a plurality of numbers, wherein each number of the plurality of numbers corresponds to a corresponding temperature range of a plurality of temperature ranges. The method may have a further characterization by which the determining is further characterized by each of the plurality of numbers being affected by changes in the number of pulses required to achieve a soft program state at the corresponding temperature range. The method may have a further characterization by which wherein the determining is further characterized by each of the plurality of numbers being a percentage of the number of pulses required to achieve a soft program at the corresponding temperature range. The method may have a further characterization by which performing compaction on the NVM array before commencing the applying the first number of soft program pulses.

Also disclosed is a non-volatile memory (NVM) that includes an NVM array. The NVM further includes charge pumps that provide a power supply for use in generating soft program pulses. The NVM further includes a temperature sensor that provides a signal indicative of a temperature of the NVM array. The NVM further includes a controller, coupled to the NVM array, the temperature sensor, and the charge pumps. The controller determines a first number of soft program verifies to skip based on a temperature of the NVM array, applies soft program pulses to a first section of the NVM array, and performs, for a first time after the first number of soft program pulses to skip has been reached, a soft program verify of the first section of the NVM array. The NVM has a further characterization by which, if the controller determines the first soft program verify was not successful, the controller alternately applies soft program pulses and performs the soft program verify until a determination that the soft program verify on the section has been successful. The NVM has a further characterization by which the first number of performances of the soft program verifies to skip is further based on a number of program/erase cycles already performed on a block of the NVM array that includes the first section of the NVM array. The NVM has a further characterization by which the first number of performance of the soft program verify to skip is selected from a plurality of numbers, wherein each of the plurality of numbers correspond to a different temperature range. The NVM has a further characterization by which at least one of the plurality of numbers is affected by changes in how many pulses are required to achieve a soft program state at the temperature range to which the at least one of the plurality of numbers corresponds. The NVM has a further characterization by which at least one of the plurality of numbers is a percentage of how many pulses are required to achieve a soft program state at the temperature range to which the at least one of the plurality of numbers corresponds.

Disclosed also is a method of soft programming a non-volatile memory (NVM) array. The method includes determining a first number of soft program pulses to apply before performing a soft program verify for a section of the NVM array based on a temperature of the NVM array. The method further includes applying the first number of soft program pulses to the NVM array. The method further includes in response to applying the soft program pulses to the section of the NVM array, verifying whether the section of the NVM array has been successfully soft programmed. The method may further include, if the section of the NVM array has not been successfully soft programmed, applying an additional soft program pulse to the section of the NVM array and verifying if the section of the NVM array has been successfully soft programmed after the additional soft program pulse has been applied. The method may have a further characterization by which the determining is further characterized by basing a number of soft program pulses to apply on a number of program/erase cycles previously performed on a block of the NVM array that includes the section of the NVM array.

Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. For example, other techniques for storing pulse count values may be used. Those skilled in the art should appreciate that they can readily use the disclosed conception and specific embodiments as a basis for designing or modifying other structures for carrying out the same purposes of the present disclosure without departing from the spirit and scope of the disclosure as defined by the appended claims.

What is claimed is:

1. A method of soft programming a non-volatile memory (NVM) array, comprising:
   determining a first number of soft program pulses based on a temperature of the NVM array;
   applying the first number of soft program pulses to a section of the NVM array; and
   performing a first soft program verify of the section of the NVM array for a first time after completing the applying the first number of soft program pulses.

2. The method of claim 1 further comprising:
   if the performing the first soft program verify determines soft program was not successful, applying an additional soft program pulse to the section of the NVM array followed by a soft program verification.

3. The method of claim 1, further comprising:
   determining if the first number should be updated based on a number of soft program pulses required to successfully soft program a block of the NVM array.

4. The method of claim 1, further comprising:
   if the performing the first soft program verify determines soft program of the section of the NVM was not successful, performing soft program verifies after the first number of soft program pulses are again applied until a determination that the soft programming has been successful.

5. The method of claim 1, further comprising:
   if the performing the first soft program verify determines a soft program of the section of the NVM was successful, incrementing to a next section of the NVM array and performing soft program verifies after the first number of soft program pulses are applied until a determination that the soft program has been successful.

6. The method of claim 4, wherein the determining is further characterized by the first number being further based on a number of program/erase cycles already performed on a block of the NVM array that includes the section of the NVM array.

7. The method of claim 1, wherein the determining is further characterized by the first number being further based on a number of program/erase cycles already performed on a block of the NVM array that includes the section of the NVM array.

8. The method of claim 1, wherein the determining is further characterized by the first number being selected from a plurality of numbers, wherein each number of the plurality of numbers corresponds to a corresponding temperature range of a plurality of temperature ranges.

9. The method of claim 8, wherein the determining is further characterized by each of the plurality of numbers being affected by changes in the number of pulses required to achieve a soft program state at the corresponding temperature range.

10. The method of claim 9, wherein the determining is further characterized by each of the plurality of numbers being a percentage of the number of pulses required to achieve a soft program at the corresponding temperature range.

11. The method of claim 1, wherein:
    performing compaction on the NVM array before commencing the applying the first number of soft program pulses.

12. A non-volatile memory (NVM), comprising:
    an NVM array;
    charge pumps that provide a power supply for use in generating soft program pulses;
    a temperature sensor that provides a signal indicative of a temperature of the NVM array;
    a controller, coupled to the NVM array, the temperature sensor, and the charge pumps that:
       determines a first number of soft program verifies to skip based on a temperature of the NVM array;
       applies soft program pulses to a first section of the NVM array; and
       performs, for a first time after the first number of soft program pulses to skip has been reached, a soft program verify of the first section of the NVM array.

13. The NVM of claim 12, wherein if the controller determines the first soft program verify was not successful, the controller alternately applies soft program pulses and performs the soft program verify until a determination that the soft program verify on the section has been successful.

14. The NVM of claim 13, wherein the first number of performances of the soft program verifies to skip is further based on a number of program/erase cycles already performed on a block of the NVM array that includes the first section of the NVM array.

15. The NVM of claim 14, wherein the first number of performance of the soft program verify to skip is selected from a plurality of numbers, wherein each of the plurality of numbers correspond to a different temperature range.

16. The method of claim 15, wherein at least one of the plurality of numbers is affected by changes in how many pulses are required to achieve a soft program state at the temperature range to which the at least one of the plurality of numbers corresponds.

17. The method of claim 16, wherein at least one of the plurality of numbers is a percentage of how many pulses are required to achieve a soft program state at the temperature range to which the at least one of the plurality of numbers corresponds.

18. A method of soft programming a non-volatile memory (NVM) array, comprising;
 determining a first number of soft program pulses to apply before performing a soft program verify for a section of the NVM array based on a temperature of the NVM array;
 applying the first number of soft program pulses to the NVM array; and
 in response to applying the soft program pulses to the section of the NVM array, verifying whether the section of the NVM array has been successfully soft programmed.

19. The method of claim 18, further comprising, if the section of the NVM array has not been successfully soft programmed:
 applying an additional soft program pulse to the section of the NVM array; and
 verifying if the section of the NVM array has been successfully soft programmed after the additional soft program pulse has been applied.

20. The method of claim 18, wherein the determining is further characterized by basing a number of soft program pulses to apply on a number of program/erase cycles previously performed on a block of the NVM array that includes the section of the NVM array.

* * * * *